United States Patent
Hilkene et al.

(10) Patent No.: US 11,635,338 B2
(45) Date of Patent: Apr. 25, 2023

(54) RAPID CHAMBER VACUUM LEAK CHECK HARDWARE AND MAINTENANCE ROUTINE

(71) Applicant: Applied Materials, Inc., Santa Clara, CA (US)

(72) Inventors: Martin A. Hilkene, Gilroy, CA (US); Surendra Singh Srivastava, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 193 days.

(21) Appl. No.: 17/079,040

(22) Filed: Oct. 23, 2020

(65) Prior Publication Data

US 2022/0128425 A1 Apr. 28, 2022

(51) Int. Cl.
*G01M 3/02* (2006.01)
*H01L 21/67* (2006.01)

(52) U.S. Cl.
CPC ......... *G01M 3/02* (2013.01); *H01L 21/67253* (2013.01)

(58) Field of Classification Search
CPC .................................. G01M 3/38; G01M 3/40
See application file for complete search history.

(56) References Cited

U.S. PATENT DOCUMENTS

| | | | |
|---|---|---|---|
| 5,365,772 A | 11/1994 | Ueda et al. | |
| 5,711,843 A * | 1/1998 | Jahns ................. | H01J 37/3299 700/121 |
| 5,789,754 A * | 8/1998 | Cathey .................... | G01N 21/73 250/372 |
| 6,146,492 A * | 11/2000 | Cho ................... | H01J 37/32935 156/345.24 |
| 6,192,287 B1 * | 2/2001 | Solomon ................. | H01L 22/20 714/724 |
| 6,696,362 B2 * | 2/2004 | Rossman .......... | H01L 21/31612 850/16 |
| 6,769,288 B2 * | 8/2004 | Ward ................ | H01J 37/32981 73/49.3 |

(Continued)

FOREIGN PATENT DOCUMENTS

| | | | |
|---|---|---|---|
| CN | 110017955 A * | 7/2019 | ............. G01M 3/38 |
| JP | 2012-054393 A | 3/2012 | |

(Continued)

OTHER PUBLICATIONS

ESPACENET Machine Translation of CN 110017955 A Which Originally Published on Jul. 16, 2019. (Year: 2019).*

(Continued)

*Primary Examiner* — David A. Rogers
(74) *Attorney, Agent, or Firm* — Patterson + Sheridan, LLP

(57) ABSTRACT

Methods and apparatus for detecting a vacuum leak within a processing chamber are described herein. More specifically, the methods and apparatus relate to the utilization of a spectral measurement device, such as a spectral gauge, to determine the leak rate within a process chamber while the process chamber is held at a leak test pressure. The spectral measurement device determines the rate of increase of one or more gases within the processing chamber and can be used to determine if the processing chamber passes or fails the leak test.

20 Claims, 6 Drawing Sheets

(56) References Cited

U.S. PATENT DOCUMENTS

| | | | |
|---|---|---|---|
| 6,813,534 B2* | 11/2004 | Sui | H01J 37/32935 216/60 |
| 6,878,214 B2* | 4/2005 | Murugesh | H01J 37/32862 134/22.18 |
| 7,062,347 B2* | 6/2006 | Yamamoto | H01J 37/32935 700/121 |
| 7,381,651 B2* | 6/2008 | Sakthivel | H01L 21/31138 257/E21.256 |
| 7,456,939 B2* | 11/2008 | Powell | G01N 21/73 436/16 |
| 7,458,247 B2* | 12/2008 | Moriya | G01N 15/06 356/336 |
| 7,464,581 B2* | 12/2008 | Moriya | G01N 15/0272 356/336 |
| 7,580,119 B2* | 8/2009 | Powell | G01N 21/73 436/16 |
| 7,590,498 B1* | 9/2009 | Chung | G01M 3/38 702/51 |
| 7,797,984 B2* | 9/2010 | Nakayama | H01J 37/32935 356/336 |
| 8,393,197 B2* | 3/2013 | Monkowski | G01M 3/202 73/40.7 |
| 8,752,580 B2* | 6/2014 | Choi | H01L 21/67109 414/217 |
| 9,322,738 B2* | 4/2016 | Brucker | G01M 3/226 |
| 9,395,263 B2* | 7/2016 | Wang | G01M 3/34 |
| 9,543,126 B2* | 1/2017 | Riker | C23C 14/046 |
| 9,929,037 B2 | 3/2018 | Ranish | |
| 10,043,693 B1* | 8/2018 | Kim | H01L 21/67276 |
| 10,177,014 B2* | 1/2019 | Raj | H01L 21/68792 |
| 10,197,470 B2* | 2/2019 | Waxman | G01N 21/3504 |
| 10,224,182 B2* | 3/2019 | Keil | H01J 37/3255 |
| 11,143,572 B2* | 10/2021 | Waxman | G01N 33/0036 |
| 2003/0010092 A1* | 1/2003 | Lu | G01M 3/3236 73/40 |
| 2003/0046976 A1* | 3/2003 | Hanazaki | G01N 21/68 118/723 R |
| 2004/0083797 A1* | 5/2004 | Ward | G01M 3/226 73/40.7 |
| 2005/0037500 A1* | 2/2005 | Ciovacco | H01J 37/3244 436/3 |
| 2005/0046825 A1* | 3/2005 | Powell | G01N 21/73 356/72 |
| 2006/0051520 A1* | 3/2006 | Behle | H01J 37/32972 118/723 R |
| 2007/0221620 A1* | 9/2007 | Sakthivel | H01J 37/32972 216/60 |
| 2009/0229348 A1* | 9/2009 | Woo | G01N 21/68 73/40.5 R |
| 2015/0211955 A1* | 7/2015 | Bounouar | G01M 3/38 73/49.3 |
| 2016/0097713 A1* | 4/2016 | Kester | G01M 3/38 356/51 |
| 2017/0097273 A1 | 4/2017 | Yang | |
| 2017/0299459 A1* | 10/2017 | Spartz | G01M 3/3281 |
| 2018/0342377 A1 | 11/2018 | Gopalan et al. | |
| 2018/0364084 A1 | 12/2018 | Cheng et al. | |
| 2020/0053836 A1 | 2/2020 | Ranish et al. | |
| 2020/0251362 A1 | 8/2020 | Luckner et al. | |
| 2020/0373195 A1 | 11/2020 | Lau et al. | |
| 2022/0065735 A1* | 3/2022 | Hilkene | G05B 15/02 |

FOREIGN PATENT DOCUMENTS

| | | |
|---|---|---|
| KR | 10-1664192 | 10/2016 |
| WO | 2021/025819 A1 | 2/2021 |

OTHER PUBLICATIONS

International Search Report and Written Opinion dated Jan. 11, 2022 for Application No. PCT/US2021/052344.

* cited by examiner

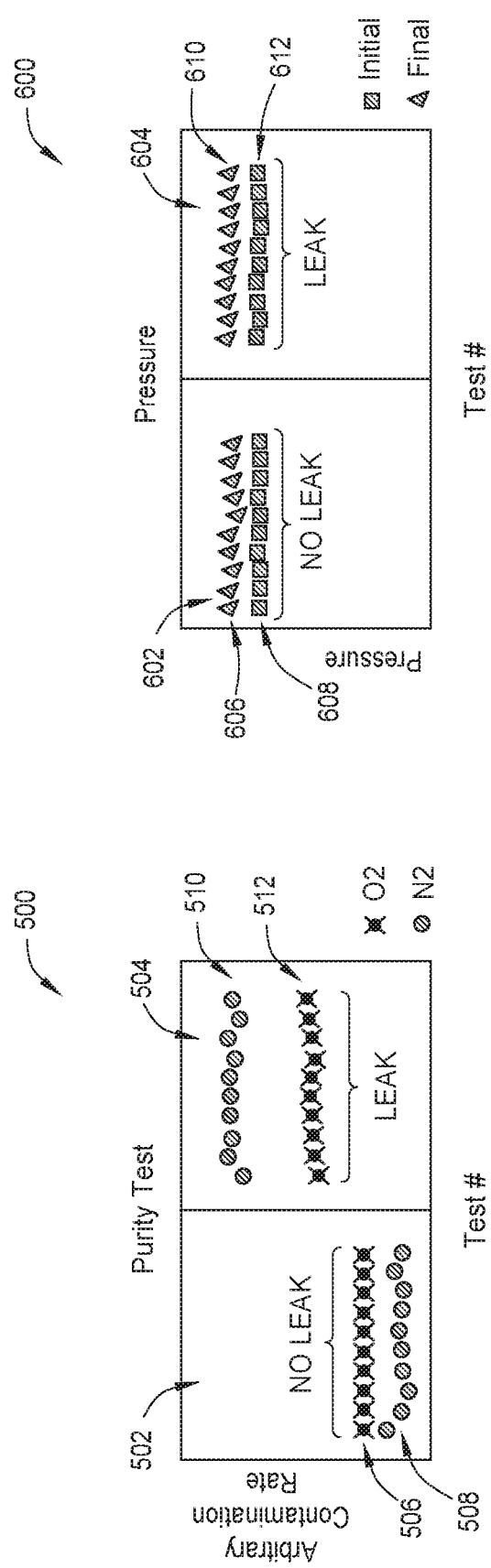

RAPID CHAMBER VACUUM LEAK CHECK HARDWARE AND MAINTENANCE ROUTINE

BACKGROUND

Field

Embodiments of the present disclosure generally relate to apparatus and methods for semiconductor processing. More particularly, the methods and apparatus disclosed relate to leak detection within a semiconductor processing chamber.

Description of the Related Art

Semiconductor substrates are processed for a wide variety of applications, including the fabrication of integrated devices and microdevices. During processing, a substrate is positioned on a susceptor or substrate support within a process chamber. Semiconductors are processed using extremely precise process conditions and gas flow rates. This is especially true in epitaxial deposition processes and rapid thermal processing. Vacuum sealing of the process chamber is important to keep outside air or process gases from leaking into the process chamber during operation. If a vacuum component or a seal breaks between processes, a large quantity of substrates may be run through the chamber and contaminated before a leak is detected.

Traditional leak testing requires cooling a chamber and running a standard pressure rate of rise test to detect any leaks caused by component failure. This process may include cooling the chamber, stabilizing the temperature and pressure within the chamber, taking rate of rise data after pumping and isolating the chamber, reheating the chamber, and requalifying the chamber for semiconductor processing. This process takes a large quantity of time to cool the chamber down and re-heat the process chamber to a processing temperature. Once re-heated, the process chamber must be re-qualified and conditioned before substrates are able to once again be processed. The cooling, re-heating, and re-qualification causes extensive downtime and loss of production. Alternative methods include the use of a helium leak measurement tool which measures the amount of helium within the chamber. While these systems are sometimes capable of measuring small leaks, traditional processes require significant downtime of the system, which reduces the amount of time in which the chamber is available for semiconductor processing.

Therefore, a need exists for improved methods and apparatus for quickly detecting small vacuum or seal leaks caused by component wear or failure while maintaining the chamber at a processing temperature.

SUMMARY

The present disclosure generally relates to methods and apparatus for detecting a vacuum leak within a semiconductor processing chamber. In one embodiment, a method of detecting a vacuum leak is described herein. The method includes pumping a process chamber from a first pressure to a second pressure, wherein the second pressure is less than the first pressure. The method further includes enabling a spectral gauge and closing a chamber isolation valve after pumping the chamber to the second pressure. Spectral data is collected from a conduit using the spectral gauge for a sample time. A chamber leak rate is calculated from the spectral data.

In another embodiment, a method of processing a substrate includes performing a leak detection test. The leak detection test includes pumping a process chamber to a leak test pressure, enabling a spectral gauge, closing a chamber isolation valve after pumping the chamber to the second pressure, collecting spectral data from a conduit using the spectral gauge for a sample time, and calculating a chamber leak rate from the spectral data. After the leak detection test, the process chamber is leaked from the leak test pressure to a processing pressure greater than the leak test pressure after collecting the spectral data and a substrate processing operation is performed on a number of substrates after pumping the process chamber to the processing pressure. The performing a leak detection test is repeated after performing the substrate processing operation on the number of substrates.

In yet another embodiment, a process chamber for processing a substrate is described. The process chamber includes a chamber body defining a processing volume, a process gas inlet, and a process gas outlet. The process gas outlet includes a first conduit fluidly coupled between the processing volume and an exhaust pump, a chamber isolation valve disposed between the processing volume and the exhaust pump, and a spectral gauge fluidly coupled to the first conduit between the processing volume and the chamber isolation valve. A controller is coupled to the process chamber. The controller is configured to pump the process chamber to a leak test pressure, enable the spectral gauge, close the chamber isolation valve after pumping the chamber to the leak test pressure, collect spectral data from the first conduit using the spectral gauge for a sample time, and calculate a chamber leak rate from the spectral data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5 is a graph illustrating the measured purity of a sample within a processing chamber over several trials.

FIG. 6 is a graph illustrating the measured initial and final pressures within a process chamber over several trials.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus and methods for semiconductor processing. More particularly, the present disclosure relates to the detection of vacuum leaks within thermal processing chambers. The apparatus for detecting the vacuum leak includes an optical emission spectrometer attached to the processing chamber's vacuum system above a chamber isolation valve. The optical emission spectrometer measures the concentration of different gases within the exhaust lines and determines a leak rate. In some embodiments, the optical emission spectrometer measures the leakage of $N_2$ and/or $O_2$ into the processing chamber.

By utilizing the optical emission spectrometer and methods described herein, chamber leaks are able to be detected at leak rates of less than 0.5 mTorr/minute. The chamber leaks are able to be detected in under three minutes every so many hours at the same temperature as the processing chamber. Therefore, there is no need to lower the temperature of the processing chamber and small leaks can be detected in a short timeframe without human intervention or significant downtime of the process chamber. Previous methods for running test leaks every four hours cause about a 3% drop in tool availability. Embodiments of the present disclosure reduce the drop in tool availability to only a 0.5% drop in tool availability.

Figure 1:
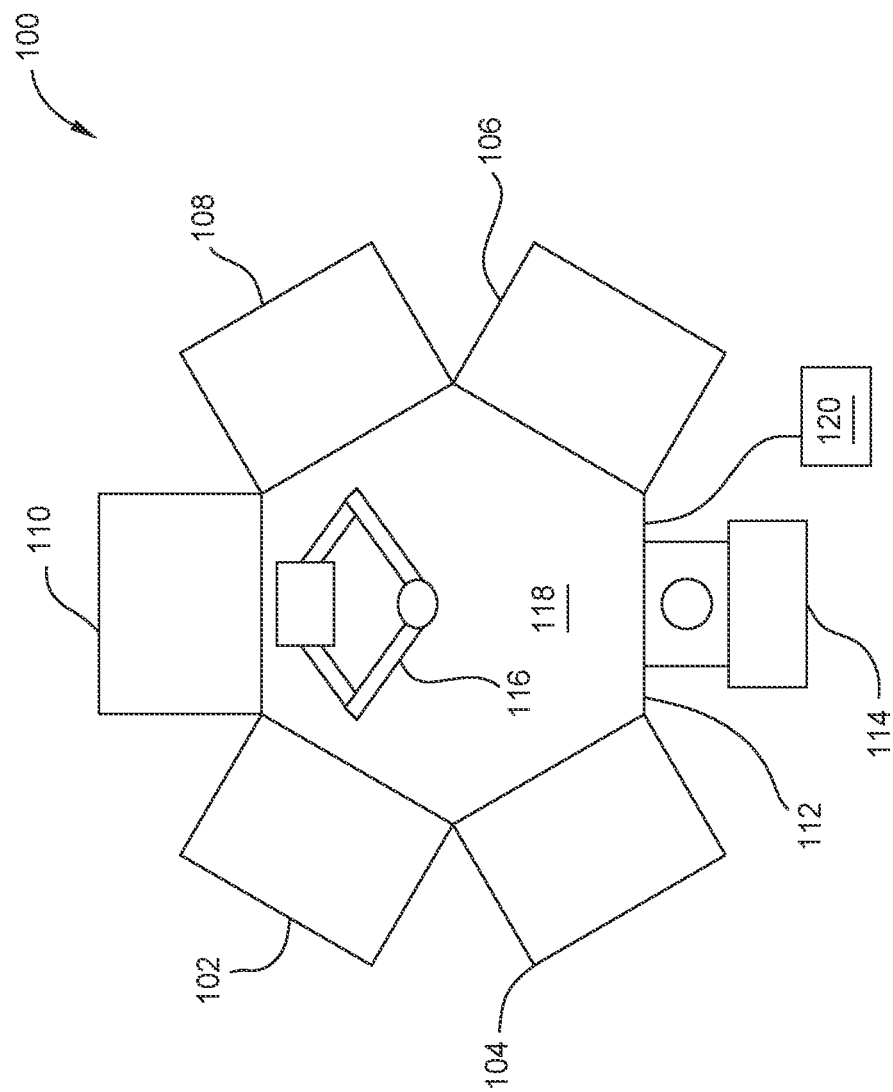
FIG. 1 is a schematic sectional view of a substrate processing system, according to one embodiment.
Figure 2A:
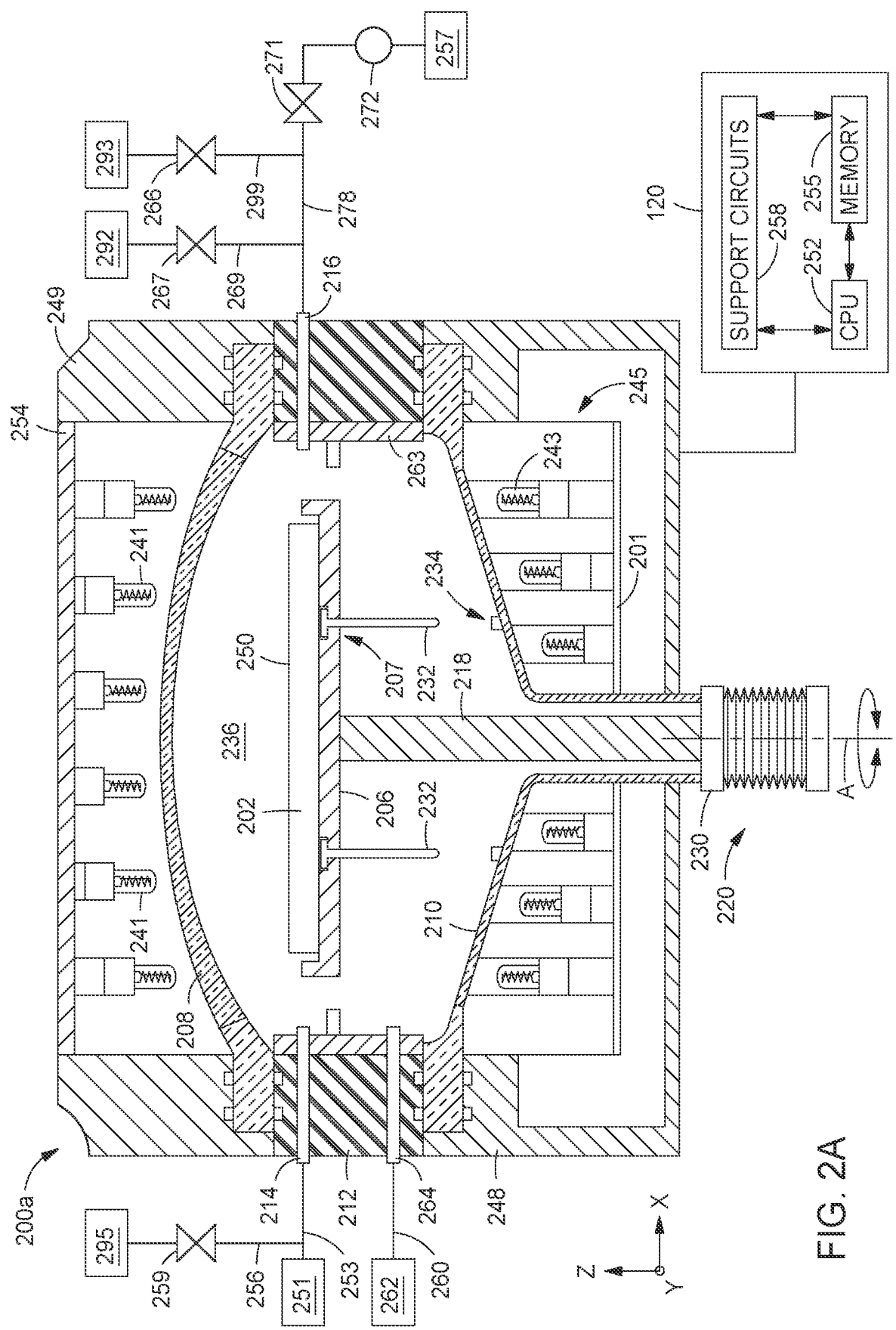
FIG. 2A is a schematic sectional view of a processing chamber, according to one embodiment.

FIG. 1 is a schematic sectional view of a substrate processing system 100, according to one embodiment. The system 100 is a cluster tool that includes a first chamber 102, a second chamber 104, a third chamber 106, a fourth chamber 108, a fifth chamber 110, and a central transfer chamber 112 that defines a transfer space 118 that contains a central transfer robot 116. The system 100 further includes a controller 120 coupled to the system 100. The controller 120 is programmed to execute a plurality of instructions for the operation of the system 100 to fabricate semiconductor devices, including operation of the central transfer robot 116 as well as operation of the chambers 102-110 and a loading chamber 114. As shown in FIG. 2A, the controller 120 includes a programmable central processing unit (CPU) that is operated with a memory 255 and a mass storage device, an input control unit, and a display unit (not shown). The controller 120 includes hardware for monitoring substrate processing through sensors in the process chambers and monitors the precursor, process gas, and purge gas flow. Support circuits 258 are coupled to the CPU 252 for supporting the processor in a conventional manner. The chambers 102-110 are each disposed about and coupled to the central transfer chamber 112. The central transfer robot 116 is configured to transfer substrates between the loading chamber 114 and the one or more chambers 102-110 through the transfer space 118.

While not shown in FIG. 1, chambers 102, 104, 106, 108, and/or 110 of the system 100 can further include one or more remote plasma sources, and one or more gas sources for precursor gases, carrier gases, and other process gases. The system 100 can also include a plurality of components such as sensors and controls configured to control pressure, temperature, gas flow, and gas composition in some or all of the chambers 102-110. The system 100 can thus be configured to form desired structures and devices. Each of the chambers 102, 104, 106, 108, and/or 110 may be one of a variety of different types of semiconductor processing chambers. Exemplary chambers include epitaxial deposition chambers, rapid thermal processing (RTP) chambers, etch chambers, thermal chemical vapor deposition (CVD) chambers, plasma enhanced CVD (PECVD) chambers, or cleaning chambers.

FIG. 2A is a schematic sectional view of a deposition chamber 200a, according to one embodiment. The deposition chamber 200a can be any one of the chambers 102-110 within FIG. 1. The deposition chamber 200a described herein is an epitaxial deposition chamber or a thermal deposition chamber. The deposition chamber 200a is generally utilized to grow an epitaxial film on a substrate, such as a substrate 202. The deposition chamber 200a creates a cross-flow of precursors across a top surface 250 of the substrate 202.

The deposition chamber 200a includes an upper body 249, a lower body 248 disposed below the upper body 249, and a flow module 212 disposed between the upper body 249 and the lower body 248. The upper body 249, the flow module 212, and the lower body 248 form a chamber body. Disposed within the chamber body is a susceptor 206, an upper dome 208, a lower dome 210, a plurality of upper lamps 241, and a plurality of lower lamps 243. The controller 120 is coupled to the deposition chamber 200a, and may be used to control all chamber processes described herein. The susceptor 206 is disposed between the upper dome 208 and the lower dome 210. The plurality of upper lamps 241 are disposed between the upper dome 208 and a lid 254. The lid 254 includes a plurality of sensors (not shown) disposed therein for measuring the temperature within the deposition chamber 200a. The plurality of lower lamps 243 are disposed between the lower dome 210 and a floor 201. The plurality of lower lamps 243 form a lower lamp assembly 245.

A processing volume 236 is formed between the upper dome 208 and the lower dome 210. The processing volume 236 has the susceptor 206 disposed therein. The susceptor 206 includes a top surface on which the substrate 202 is disposed. The susceptor 206 is attached to a shaft 218. The shaft is connected to a motion assembly 220. The motion assembly 220 includes one or more actuators 230 and/or adjustment devices that provide movement and/or adjustment of the shaft 218 and/or the susceptor 206 within the processing volume 236.

The susceptor 206 may include lift pin holes 207 disposed therein. The lift pin holes 207 are sized to accommodate a lift pin 232 for lifting of the substrate 202 from the susceptor 206 either before or after a deposition process is performed. The lift pins 232 may rest on lift pin stops 234 when the susceptor 206 is lowered from a processing position to a transfer position.

The flow module 212 includes a plurality of process gas inlets 214, a plurality of purge gas inlets 264, and one or more exhaust gas outlets 216. The plurality of process gas inlets 214 and the plurality of purge gas inlets 264 are disposed on the opposite side of the flow module 212 from the one or more exhaust gas outlets 216. A liner 263 is disposed on the inner surface of the flow module 212 and protects the flow module 212 from reactive gasses used during deposition processes. The process gas inlets 214 and the purge gas inlets 264 are positioned to flow a gas parallel to the top surface 250 of a substrate 202 disposed within the processing volume 236.

The process gas inlets 214 are fluidly connected to a process gas source 251 via a process gas conduit 253. The purge gas inlets 264 are fluidly connected to a purge gas source 262 via a purge gas conduit 260. The one or more exhaust gas outlets 216 are fluidly connected to an exhaust pump 257 via an exhaust gas conduit 278.

A reference leak device 295 is fluidly coupled to the process gas conduit 253 via a reference leak conduit 256. A reference leak isolation valve 259 is disposed along the reference leak conduit 256 and between the reference leak isolation valve 259 and the process gas conduit 253. During calibration of leak detection, the reference leak device 295 may emit a small amount of leak gas through the reference leak conduit 256 and into the process gas conduit 253 before the leak gas enters the processing volume 236. The small leak, which may be emitted by the reference leak device 295, may be about 0.005 sccm to about 3 sccm, such as about 0.01 sccm to about 2 sccm, such as about 0.02 sccm to about 1 sccm. In some embodiments, the amount of leak gas is less than about 0.03 sccm, such as less than about 0.025 sccm. In some embodiments, the reference leak device 295 is a small gas panel. The reference leak isolation valve 259 may open to allow the leak gas to escape through the reference leak conduit 256. The reference leak isolation valve 259 is closed otherwise and seals the reference leak device 295 from the processing volume 236. In some embodiments, the reference leak isolation valve 259 is used to protect the reference leak device 295 during the flow of process gases through the process gas inlets 214.

A chamber isolation valve 271 is disposed between the exhaust gas outlets 216 and the exhaust pump 257 along the exhaust gas conduit 278. The chamber isolation valve 271 is able to be opened or closed to form a seal between the exhaust gas outlets 216 and the exhaust pump 257, such that when the chamber isolation valve 271 is closed, no gas escapes from the processing volume 236 through the exhaust gas conduit 278. A spectral gauge 292 and a vacuum gauge 293 are fluidly connected to the exhaust gas conduit 278 between the exhaust gas outlets 216 and the chamber isolation valve 271.

A throttle valve 272 is additionally disposed between the chamber isolation valve 271 and the exhaust pump 257. The throttle valve 272 is configured to control the flowrate of gases through the exhaust gas conduit 278 during substrate processing. The throttle valve 272 and the chamber isolation valve 271 in some embodiments may be the same. However, it is sometimes difficult to control the flow of the process gases through the exhaust gas conduit 278 with only one of the throttle valve 272 or the chamber isolation valve 271. For example, the throttle valve 272 may not form a complete seal between the processing volume 236 and the exhaust pump 257. While the chamber isolation valve 271 is generally able to form a seal between the processing volume 236 and the exhaust pump 257, the chamber isolation valve 271 may be less efficient at precise control of the flow of process gases during substrate processing. However, in some embodiments, a valve may be used which is able to form an adequate seal while performing leak calibration and accurately controlling the flowrate of the gases through the exhaust gas conduit 278 during substrate processing.

The spectral gauge 292 is either fluidly or optically coupled to the exhaust gas conduit 278. The spectral gauge 292 is a spectrometer and is used to measure the composition of gases within the exhaust gas conduit 278. The spectral gauge 292 may be fluidly coupled to the exhaust gas conduit 278 by a first gauge conduit 269. The first gauge conduit 269 may have a first valve 267 disposed thereon, such that the first valve 267 is disposed fluidly between the spectral gauge 292 and the connection of the first gauge conduit 269 to the exhaust gas conduit 278. The first valve 267 is configured to be closed during substrate processing within the processing volume 236. Closing the first valve 267 prevents the flow of process gases to the spectral gauge 292, as the spectral gauge 292 may be sensitive to exposure to process gases. The first valve 267 is opened during vacuum leak checks within the deposition chamber 200a. The gas from the exhaust gas conduit 278 flows into the spectral gauge 292 and the spectral gauge 292 determines the concentration of one or more gases within the exhaust gas conduit 278.

In some embodiments, the spectral gauge 292 is an optical emission spectrometer, such as a remote plasma optical emission spectrometer. The spectral gauge 292 is utilized to measure optical emissions within a range of 250 nm to about 1000 nm, such as about 300 nm, to about 900 nm, such as 300 nm to about 880 nm. In some embodiments, the optical emission ranges of a gas sample are measured within an in-situ plasma cavity. In other embodiments, the spectral gauge 292 may be optically coupled to the exhaust gas conduit 278 and measures the concentrations of gases within the exhaust gas conduit 278 through a window (not shown) disposed through the side of the exhaust gas conduit 278. The window may be accompanied by one or more reflectors disposed about the inner surface of a portion of the exhaust gas conduit 278.

The vacuum gauge 293 is fluidly coupled to the exhaust gas conduit 278. The vacuum gauge 293 is configured to measure the pressure within the exhaust gas conduit 278. The vacuum gauge 293 assists in determining if there are any major leaks within the system and is also used during calibration of the spectral gauge 292. The vacuum gauge 293 may be a pressure gauge and may have a precision of less than 0.01 Torr, such as less than 5 mTorr, such as less than 1 mTorr. In some embodiments, the vacuum gauge 293 is fluidly coupled to the exhaust gas conduit 278 via a second gauge conduit 299. The second gauge conduit 299 is coupled to the exhaust gas conduit 278 on one end and the vacuum gauge 293 on the opposite end. Disposed on the second gauge conduit 299 is a second valve 266. The second valve 266 is disposed between the exhaust gas conduit 278 and the vacuum gauge 293 along the second gauge conduit 299. The second valve 266 is similar to the first valve 267 in that the second valve 266 may be closed during substrate processing and open during vacuum leak checks as described herein. The second valve 266 may close off the vacuum gauge 293 from the exhaust gas conduit 278 when closed, such that process gases do not reach the vacuum gauge 293.

The exhaust pump 257 may be any suitable gas pump for use within a substrate processing chamber. The exhaust pump 257 may be part of an exhaust assembly (not shown). In some embodiments, the exhaust pump 257 is utilized with multiple process chambers and is adjustable in strength depending upon the desired pressures and vacuum within the process chambers.

Figure 2B:
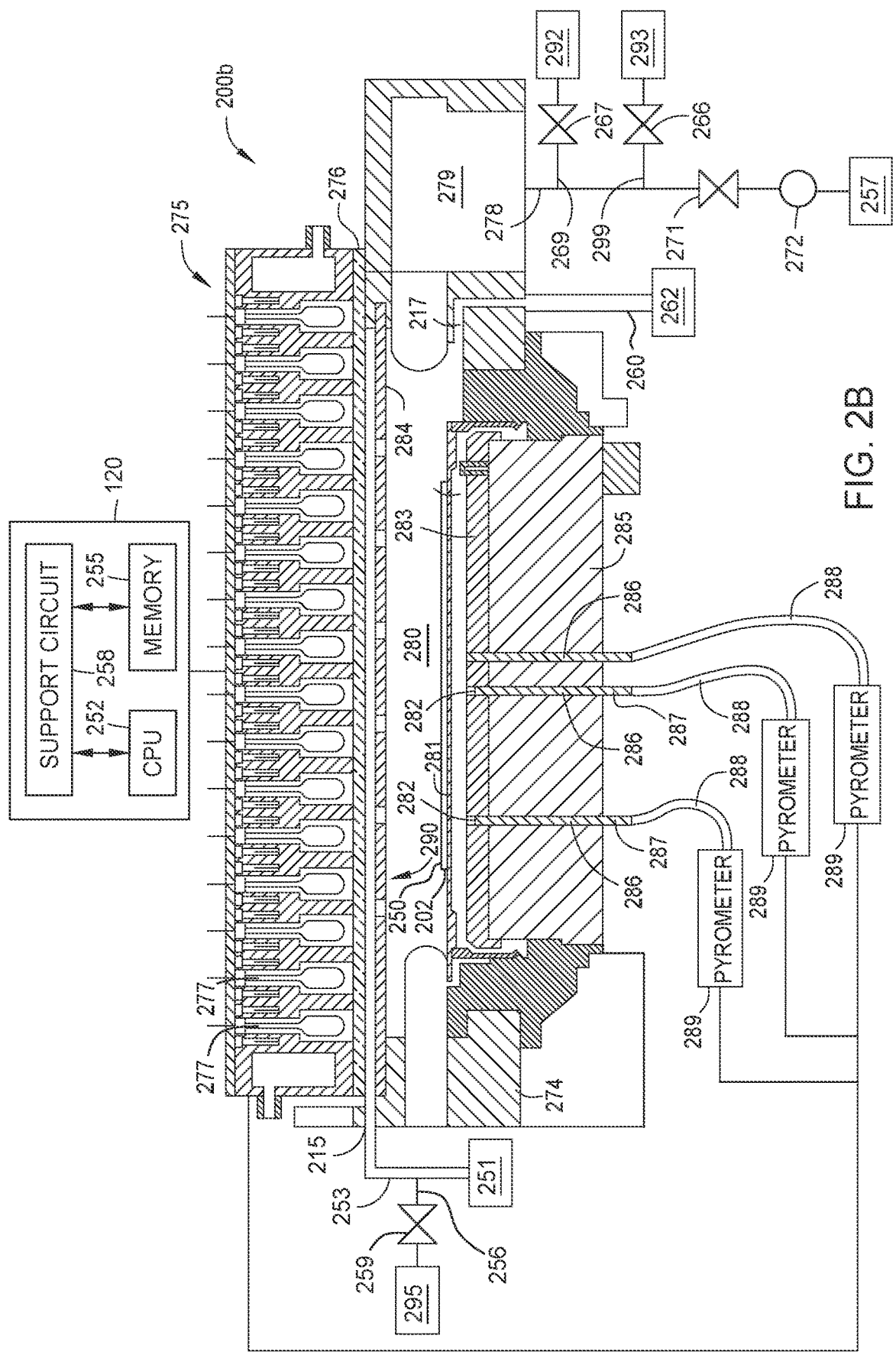
FIG. 2B is a schematic sectional view of a processing chamber, according to another embodiment.

FIG. 2B is a schematic sectional view of a deposition chamber 200b, according to another embodiment. The deposition chamber 200b can be any one of the chambers 102-110 within FIG. 1. The deposition chamber 200b is a rapid thermal processing (RTP) chamber. Exemplary RTP chambers may include the RADIANCE® or RADIANCE® Plus chambers available from Applied Materials, Inc. of Santa Clara, Calif.; however, chambers by other manufacturers are also contemplated. The deposition chamber 200b is generally utilized to deposit films on a substrate for the formation of a semiconductor device, such as the substrate 202. The deposition chamber 200b deposits precursors onto the top surface 250 of the substrate 202.

The deposition chamber 200a includes an upper heating assembly 275, a body 274, a base 285, a susceptor 281, a first window 284, a plurality of pyrometers 289, a plurality of light pipes 286, a process gas source 251, an exhaust pump 257, and a purge gas source 262.

The upper heating assembly 275 is disposed on top of the body 274 of the deposition chamber 200a. The body 274 may be one component or a plurality of components which encircle the base 285 and supports the upper heating assembly 275. The body 274 may include a process gas inlet 215, a purge gas inlet 217, and an exhaust gas outlet 279. The first window 284 with a plurality of apertures 290 formed therethrough is disposed within an upper portion of the body 274, such that the first window 284 rests on top of a portion of the body 274. The first window 284 further serves as a radiation window for radiation emitted by the upper heating assembly 275. In some embodiments, the first window 284 is a quartz window.

The upper heating assembly 275 is disposed above the first window 284 and separated from the first window 284 by a second window 276. The second window 276 and the first window 284 form a distribution plenum above a processing volume 280. The upper heating assembly 275 is coupled to the second window 276 and includes a plurality of lamps 277 for rapidly heating the processing volume 280 and the top surface of the substrate 202. The lamps 277 are surrounded by one or more cooling channels. The lamps within the upper heating assembly 275 may be controlled by a controller, such as the controller 120. The radiation from the upper heating assembly 275 enters the processing volume 280 through the first window 284 and the second window 276. Alternatively (not shown), the upper heating assembly 275 is a lower heating assembly and is configured to heat the backside of the substrate 202, for example, by being disposed below the substrate 202 and directing the radiation to the backside of the substrate 202.

The base 285 is disposed within the body 274 and below the susceptor 281. The base 285 may be used to support the susceptor 281. The base 285 may be a water cooled base and has a reflector 283 mounted on the top surface to reflect radiation, such that the reflector 283 reflects radiation from the upper heating assembly 275 to the backside of the susceptor 281 and the substrate 202. The susceptor 281 is configured to support the substrate 202 and is disposed on top of the base 285 and below the first window 284.

The temperature at localized regions of the substrate 202 are measured by the pyrometers 289. The pyrometers 289 are configured to measure the temperature of the substrate 202 by measuring the radiation emitted by the substrate 202. Radiation from the substrate 202 is emitted into the light pipes 286 disposed through the base 285. The light pipes 286 are positioned to receive radiation from different radial locations along the substrate 202. The upper portion 282 of each of the light pipes 286 is positioned adjacent to the underside of the substrate 202 and the susceptor 281, while the lower portion 287 of each of the light pipes 286 is attached to a flexible optical fiber 288. The flexible optical fiber 288 is disposed between the light pipes 286 and the pyrometers 289 and optically couples the lower end of the light pipes 286 to the pyrometers 289, such that the light pipes 286 and the flexible optical fiber 288 transfer radiation emitted by the substrate 202 and/or the susceptor 281 to the pyrometers 289. Each light pipe 286 is positioned within the base 285 such that its upper portion 282 is flush with or slightly below the upper surface of the base 285, such as slightly below or flush with the upper surface of the reflector 283. In some embodiments, the light pipe 286 is directly connected to the pyrometers 289 without the use of a flexible optical fiber 288.

The pyrometers 289 are connected to the controller 120, which controls the power supplied to the upper heating assembly 275 in response to a measured substrate temperature. In some implementations, such as for a 200 mm substrate, the upper heating assembly 275 uses a plurality of lamps, such as 187 lamps 277, to deliver highly collimated radiation from tungsten-halogen lamps to the processing volume 280. In some implementations, such as for a 300 mm substrate, the upper heating assembly 275 may use a plurality of lamps, such as 409 lamps 277. The number and configuration of the lamps disclosed herein are exemplary and other numbers and configurations of lamps may be used.

Similar to the process gas inlets 214 of the deposition chamber 200a of FIG. 2A, the process gas inlet 215 is fluidly connected to the process gas source 251 via a process gas conduit 253. The purge gas inlet 217 is fluidly connected to the purge gas source 262 via a purge gas conduit 260. The exhaust gas outlet 279 is fluidly connected to the exhaust pump 257 via an exhaust gas conduit 278.

As described with respect to FIG. 2A, the reference leak device 295 is fluidly coupled to the process gas conduit 253 via a reference leak conduit 256 and a reference leak isolation valve 259 is disposed along the reference leak conduit 256 between the reference leak isolation valve 259 and the process gas conduit 253.

As described with respect to FIG. 2A, a chamber isolation valve 271 is disposed between the exhaust gas outlet 279 and the exhaust pump 257 along the exhaust gas conduit 278. A spectral gauge 292 and a vacuum gauge 293 are fluidly connected to the exhaust gas conduit 278 between the exhaust gas outlet 279 and the chamber isolation valve 271. A throttle valve 272 is additionally disposed between the chamber isolation valve 271 and the exhaust pump 257.

The exhaust pump 257 may be any suitable gas pump for use within a substrate processing chamber. The exhaust pump 257 may be part of an exhaust assembly (not shown). In some embodiments, the exhaust pump 257 is utilized with multiple process chambers and is adjustable in strength depending upon the desired pressures and vacuum within the process chambers.

The controller 120 may control any of the pyrometers 289, the upper heating assembly 275, the process gas source 251, the reference leak device 295, the exhaust pump 257, the spectral gauge 292, the vacuum gauge 293, and any of the valves 259, 266, 267, 271, 272.

Figure 3:
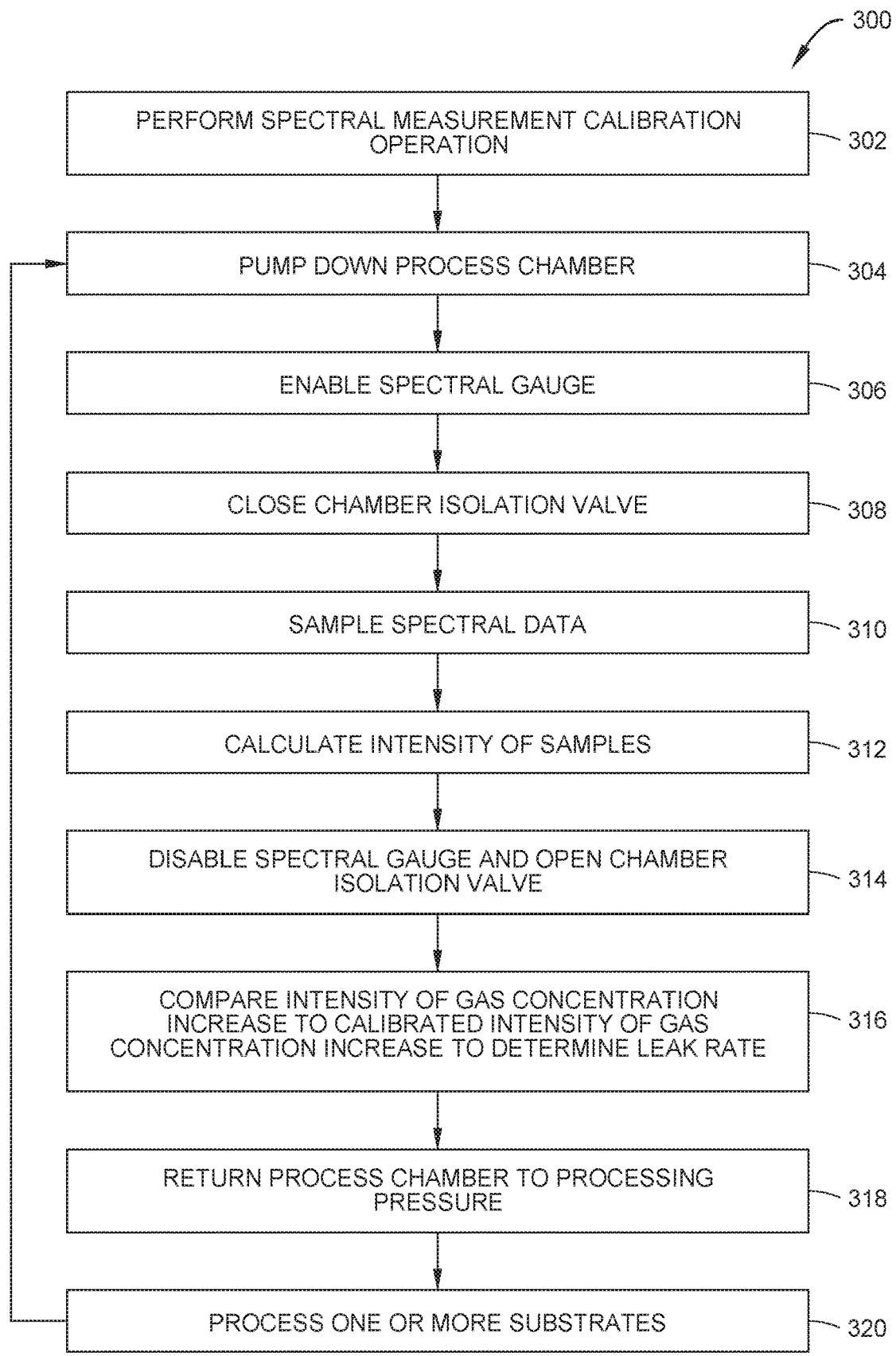
FIG. 3 is a method of measuring a leak rate within one of the processing chambers of FIG. 2A or FIG. 2B, according to one embodiment.

FIG. 3 is a method 300 of measuring a leak rate within one of the processing chambers of FIG. 2A or FIG. 2B, according to one embodiment. The method 300 includes a first operation 302, a second operation 304, a third operation 306, a fourth operation 308, a fifth operation 310, a sixth operation 312, a seventh operation 314, an eighth operation 316, a ninth operation 318, and a tenth operation 320 as described herein.

The first operation 302 is a calibration operation. The first operation 302 is performed after installation or maintenance is performed on a processing system or cluster tool. The first operation 302 is used to calibrate the spectral gauge 292 and/or the vacuum gauge 293. The first operation 302 may include all of the operations described with respect to FIG. 4 or other alternative calibration methods. In some embodiments, the spectral gauge 292 and/or the vacuum gauge 293 are calibrated at additional or alternative points throughout the method 300. The first operation 302 is described in further detail herein with respect to FIG. 4.

The second operation 304 includes pumping down the process chamber from a first pressure to a second pressure, the second pressure being less than the first pressure. The first pressure may be a pressure of a processing chamber, such as one of the deposition chambers 200a, 200b, during the last portion of a deposition operation or after the chamber has been pressurized after the calibration process. In some operations, if the chamber was calibrated without bringing the chamber back up to a substrate processing pressure, the first pressure and the second pressure may be equal. During the second operation 304 no gas is being flown into the chamber from process gas or purge gas sources. The flow of gas into the chamber from the process gas and/or purge gas sources are ceased during or before the second operation 304. The second pressure is the pressure at which the minimum amount of gas within each of the conduits, such as the conduits 253, 256, 260, 269, 278, or 299, leaks into the processing volume, such as the processing volumes 236 and 280. The second pressure may also be referenced as the testing pressure or leak testing pressure.

As the pressure is lowered within the processing chamber, gases from the conduits backstream into the chamber and outgassing from gas deposits within the chamber occur. This makes detection of leaks into the processing chamber more difficult. Therefore, the pressure within the chamber should be low enough to remove gas within the chamber to have a vacuum, but high enough to reduce any backstreaming effect. The second pressure may be determined during the second operation 304 by monitoring emissions from one or more of the conduits 253, 256, 260, 269, 278, or 299 during the pump down cycle so that emission intensity is below an acceptable threshold at the second pressure. Alternatively, the second pressure may be predetermined during the first operation 302. In some embodiments, the first pressure is about 20 Torr to about 200 Torr, such as about 50 Torr to about 150 Torr, such as about 60 Torr to about 100 Torr, such as about 70 Torr to about 90 Torr, such as about 80 Torr. In some embodiments, the second pressure is less than about 500 mTorr, such as about 20 mTorr to about 300 mTorr, such as about 30 mTorr to about 250 mTorr, such as about 50 mTorr to about 200 mTorr, such as about 75 mTorr to about 150 mTorr, such as about 80 mTorr to about 120 mTorr, such as about 100 mTorr.

During this operation, the processing chamber may be maintained at a substrate processing temperature. Maintaining the processing chamber at a substrate processing temperature reduces the downtime of the processing chamber during the method 300 of measuring the leak rate and therefore increased chamber availability. The substrate processing temperature may be about 100° C. to about 800° C., such as about 100° C. to about 750° C., such as about 200° C. to about 750° C. In embodiments in which an epitaxial deposition chamber is utilized, such as the deposition chamber 200a of FIG. 2A, the substrate processing temperature is about 250° C. to about 800° C., such as about 300° C. to about 750° C. In embodiments in which an RTP chamber is utilize, such as the deposition chamber 200b of FIG. 2B, the substrate processing temperature is about 150° C. to about 450° C., such as about 200° C. to about 400° C. In hot plate heater systems, the substrate processing temperature is about 100° C. to about 700° C., such as about 100° C. to about 650° C.

The third operation 306 includes enabling a spectral gauge, such as the spectral gauge 292. Enabling the spectral gauge 292 may include turning on the spectral gauge 292 or beginning sampling with the spectral gauge 292. In some embodiments, the spectral gauge 292 is running continuously in the background, but during the third operation 306, the spectral sampling data begins to be collected and/or saved. The spectral sampling data may be stored within a controller, such as the controller 120. When the spectral gauge is enabled, the valve, such as the first valve 267, between the exhaust conduit and the spectral gauge is opened to allow gases to flow to the spectral gauge from the exhaust conduit.

The fourth operation 308 includes closing the chamber isolation valve, such as the chamber isolation valve 271. The chamber isolation valve is closed to seal the processing volume, such as the processing volumes 236, 280. As the chamber isolation valve is closed, the spectral gauge measures the concentrations of different gases within the exhaust conduit and by extension the processing volume, such that the third operation 306 and the fourth operation 308 overlap or are performed simultaneously. This is performed for a stabilization time while the chamber isolation valve closes to form the seal. The stabilization time may be from about 1 second to about 20 seconds, such as about 1 second to about 15 seconds, such as about 2 seconds to about 10 seconds. After the stabilization time, the chamber isolation valve should be closed and the processing volume sealed from the exhaust gas pump. In some embodiments, the valve between the spectral gauge and the exhaust conduit is opened after the chamber isolation valve 271 is closed.

The fifth operation 310 includes sampling spectral data using the spectral gauge from within the exhaust conduit, such as the exhaust gas conduit 278. The spectral data is obtained using optical emission spectroscopy (OES). OES spectrum data is collected during the fifth operation to determine the concentrations of one or more gases within the exhaust conduit. The sampling of the spectral data may be performed by taking a plurality of samples of gas from the exhaust conduit. This may encompass flowing a small fixed amount of the gas present in the exhaust conduit into a sample volume within the spectral gauge, such as the in-situ plasma cavity of the spectral gauge. The gas within the sample volume is then optically analyzed to determine the concentration of one or more gases within the sample volume. In operations described herein, the concentrations of one or more of $N_2$, N, O, $O_2$, H, or Ar are measured. The fifth operation 310 as well as the second, third, fourth, and sixth operations 304, 306, 308, 312 may be performed at a temperature similar to the temperature at which the substrates would be processed during the tenth operation 320. In some embodiments, the temperature during the fifth operation 310 is greater than about 250° C., such as greater than about 400° C., such as greater than about 500° C., such as greater than about 750° C.

Multiple samples of the gas within the exhaust conduit are collected. In some embodiments, the gases within the exhaust conduit are measured at a rate of about 20 samples/minute to about 150 samples/minute, such as about 30 samples/minute to about 120 samples/minute, such as about 45 samples/minute to about 100 samples/minute, such as about 60 samples/minute. The samples may be collected for a total of about 15 seconds to about 100 seconds, such as about 20 seconds to about 90 seconds, such as about 30 seconds to about 75 seconds, such as about 30 seconds to about 50 seconds, such as about 32 seconds. Therefore, about 5 samples to about 180 samples may be taken, such as about 20 samples to about 180 samples, such as about 30 samples to about 120 samples.

Increasing the quantity and frequency of sampling provides improved resolution of the data and trend analysis to reveal leaks within the processing chamber. Sampling is generally performed for less than about two minutes in order to reduce the downtime of the process chamber during leak detection. As the samples are taken using OES, the elemental composition of the gases within the exhaust conduit are able to be determined and the concentrations of one or more gases are able to be determined regardless of the process gases utilized.

The sixth operation 312 is performed after the fifth operation 310 and includes calculating the intensity of gas concentration increase within one or more samples of the spectral data. The intensity of gas concentration increase within the samples is determined by measuring the rate of increase in the concentration of one or more gases associated with an air leak. In the embodiments described herein, the gases measured include $N_2$, N, O, $O_2$, and Ar. The intensity of gas concentration increase is calculated within the controller 120. The acceptable leak rate of atmosphere into the processing chamber from one of the outside environment, another chamber, a component of the exhaust system, or a component of the gas panels is determined by the user. The acceptable leak rate determines the acceptable rate of increase in concentration of the one or more gases. In some operations, the sixth operation 312 may be performed simultaneously with the collection of the spectral data during the fifth operation 310. In yet other embodiments, all of the spectral data is collected before the calculation of the purity within the process chamber.

The seventh operation 314 includes disabling the spectral gauge and opening the chamber isolation valve. After the spectral data samples have been taken during the fifth operation 310, the valve between the spectral gauge and the exhaust conduit may be closed and the spectral gauge deactivated. Either simultaneously or directly thereafter, the chamber isolation valve may be reopened to unseal the processing chamber. The valve between the spectral gauge and the exhaust conduit may be closed to protect the spectral gauge from process gases during substrate processing. The seventh operation 314 may optionally be performed before, subsequent to, or after the sixth operation 312, such that the intensity of gas concentration increase of the process chamber is calculated while the spectral gauge is being disabled and the chamber isolation valve opened or after the spectral gauge has been disabled and the chamber isolation valve opened.

The eighth operation 316 includes comparing the intensity of gas concentration increase of the samples to a calibration intensity of gas concentration increase measured during the first operation 302 to determine a leak rate and determine if the processing chamber passes or fails the leak test. The calibration intensity of gas concentration increase may be a rate of increase value at which the process chamber would fail the leak test, such that once the intensity value surpassed the calibration intensity, the process chamber would have a leak over the predetermined maximum leak value. The method for determining the calibration purity is described in greater detail with reference to FIG. 4. In some embodiments, the eighth operation 316 is performed before the spectral gauge is deactivated and the chamber isolation valve opened. The eighth operation may instead be performed subsequent to the sixth operation 312.

In some embodiments, an additional process operation may be performed if during the eighth operation 316 the process chamber is determined to have a leak over the predetermined limit. During the additional operation, a reference leak device, such as the reference leak device 295, is activated by opening a valve between the reference leak device and a process gas conduit, such as the process gas conduit 253, and the reference leak device releases a pre-set amount of leak gas. In some embodiments, the pre-set amount of leak gas is about 0.005 sccm to about 3 sccm, such as about 0.01 sccm to about 2 sccm, such as about 0.02 sccm to about 1 sccm. In some embodiments, the pre-set amount of leak gas is less than about 0.03 sccm, such as less than about 0.025 sccm. The spectral gauge may then measure the concentrations of gases within the exhaust conduit in a similar manner to that described with respect to the fifth operation 310. As a predictable quantity of a pre-known gas is being released into the process chamber, the controller may then determine if the purity calculation from the original leak determination is correct or if the system should be recalibrated and/or the leak test performed an additional time. This additional operation may be performed in embodiments in which the eighth operation 316 is performed before the seventh operation 314. The additional operation is performed before the seventh operation 314 so that the spectral gauge is still active and the chamber isolation valve is still closed. This ensures consistency of the measurement between purity test and the leak test while the reference leak device is actively providing a reference leak.

The ninth operation 318 includes pumping the process chamber to a processing pressure. The processing pressure may be a third pressure, such that the third pressure is greater than the second pressure. In some embodiments, the third pressure is the same as the first pressure. In other embodiments, the first pressure and the third pressure are different. In embodiments as disclosed herein, the third pressure is about 20 Torr to about 200 Torr, such as about 50 Torr to about 150 Torr, such as about 60 Torr to about 100 Torr, such as about 70 Torr to about 90 Torr, such as about 80 Torr. Increasing the pressure within the processing chamber may be performed by flowing one or more gases from either the process gas inlet or the purge gas inlet.

The tenth operation 320 includes processing one or more substrates within the processing chambers, such as one of the deposition chambers 200a, 200b. The processing of the one or more substrates includes performing a semiconductor formation operation on the substrates, such as a deposition operation. After the one or more substrates have been processed during the tenth operation 320, the second through tenth operations 302-320 may be repeated or looped. This loop may repeat over a predetermined time period or after a set number of substrates have been processed within the processing chambers. After repeated looping of the second through tenth operations 302-320, preventative maintenance may once more be performed and the entire method 300 may be started again.

In some operations, the leak detection operations are performed before/after every n number of substrates, such that the leak detection operations are performed before/after n substrates are processed within the processing chamber. In embodiments in which the leak test is performed between a predetermined number of substrates are processed, the leak test is performed after about 2 to about 2000 substrates have been processed within the processing chamber, such as about 25 to about 1000 substrates, such as about 100 to about 750 substrates. In other embodiments, the leak detection operations are performed after a predetermined operation time such as about 1 hour to about 24 hours, such as about 2 hours to about 12 hours, such as about 3 hours to about 5 hours. In some embodiments, the leak detection operations are performed at least once every 24 hours of system operation. In yet other embodiments, the leak detection operations are performed after maintenance of the system has been performed and/or the processing chamber has remained idle for a prolonged time.

Figure 4:
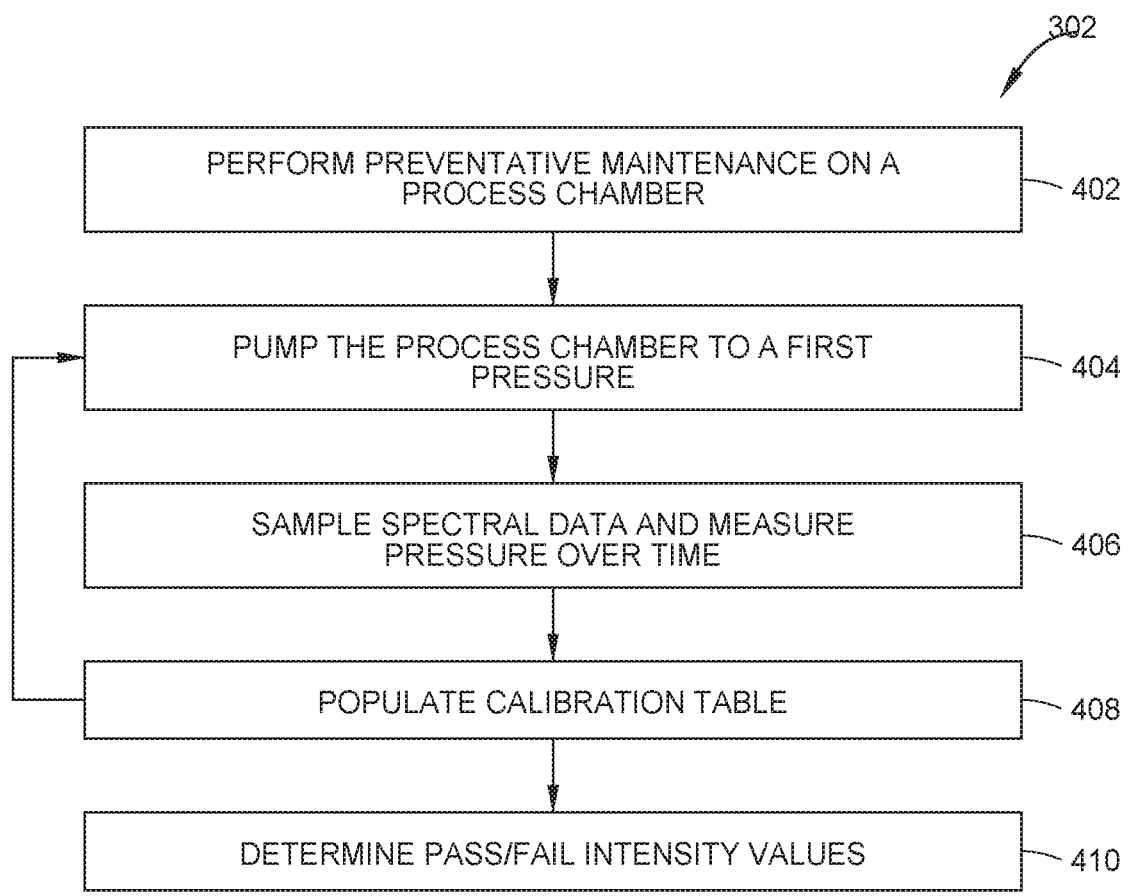
FIG. 4 is a method of calibrating a leak detection system, according to one embodiment.

FIG. 4 is a detailed calibration operation 302 of calibrating a leak detection system after maintenance, according to one embodiment. The operation 302 includes performing preventative maintenance on the process chamber during a first operation 402, pumping the process chamber to a first pressure during a second operation 404, sampling spectral data and measuring the pressure within the processing chamber over time during a third operation 406, populating a calibration table during a fourth operation 408, and calculating a pass/fail purity value for the processing chamber during a fifth operation 410.

The first operation 402 of performing preventative maintenance on the processing chamber is optionally completed at the beginning of the calibration operation 302. Preventative maintenance may include periodic cleaning of the processing chamber, servicing of a part within the processing chamber, replacement of a component within the processing chamber, or a retrofit of the processing chamber. Preventative maintenance may be performed throughout the lifetime of the processing chamber.

After performing preventative maintenance on a processing chamber, the processing chamber generally performs several initial operation procedures to warm up the processing chamber. This includes pumping the processing chamber to a processing pressure and running one or more test substrates through the processing chamber.

The second operation 404 of pumping the process chamber to a first pressure includes reducing the pressure within the process chamber from a post maintenance or processing pressure to a pressure similar to the second pressure described above. In some embodiments, the pressure is reduced to about 20 mTorr to about 300 mTorr, such as about 30 mTorr to about 250 mTorr, such as about 50 mTorr to about 200 mTorr, such as about 75 mTorr to about 150 mTorr, such as about 80 mTorr to about 120 mTorr, such as about 100 mTorr. The pumping of the process chamber to the calibration pressure may be performed in stages, such that the process chamber is pumped for a set time before pumping is stopped and the chamber is isolated to perform the third operation 406 as described below. In some embodiments, the pumping of the process chamber to the calibration pressure is performed in less than 60 seconds, such as less than 30 seconds. In some embodiments, the pumping of the process chamber to the calibration pressure is performed at about 0.1 seconds to about 60 seconds, such as about 3 seconds to 60 seconds, such as about 5 seconds to about 15 seconds.

Simultaneously with the second operation 404, the third operation 406 of sampling spectral data from the processing chamber and measuring the pressure change over time may be performed. The sampling of the spectral data is performed by a spectral gauge, such as the spectral gauge 292, as described above. The sampling of the spectral data can be performed similarly to how the spectral data is measured during the fifth operation 310 of the method 300 of FIG. 3. During the third operation 406, the pumping of the process chamber is temporarily halted and the chamber isolated using the chamber isolation valve 271 so that the rate of rise of the gases within the chamber may be determined for the pressure at which the pumping was halted.

The pressure and change over time is measured using a pressure gauge, such as the vacuum gauge 293. The pressure change over time may be calculated by taking periodic pressure measurements as the process chamber is pumped to the calibration pressure. A curve may be fitted to the pressure change measurements to determine the pressure change over time.

After the spectral data and the pressure data is obtained during the third operation 406, the spectral data may be converted to an intensity value by calculating the rate of change of the concentration of one or more gases within the processing chamber.

During the fourth operation 408, the calculated intensity values and the pressure values are plotted against one another to develop a calibration table. The calibration table may be determined for removal rates of about 0.2 mTorr/min to about 100 mTorr/minute, such as about 0.3 mTorr/minute to about 75 mTorr/minute, such as about 0.4 mTorr/minute to about 50 mTorr/minute, such as about 0.5 mTorr/minute to about 40 mTorr/minute. The intensity value may be an arbitrary value which is determined by the rate of change of the concentration of one or more gases within the processing chamber. Generally, a higher intensity value is equated to larger rate of change of the concentration of one or more gases within the processing chamber. The calibration table may also be utilized to determine an optimum pressure for using during the leak testing operations of FIG. 3, such as the second pressure described with respect to the second operation 304 of the method 300 of FIG. 3.

The second operation 404, the third operation 406, and the fourth operation 408 may be looped to populate the full calibration table. As described above, the second operation 404 is performed to pump the process chamber to a set pressure before the process chamber is isolated and sampling of the gases within the process chamber is performed to obtain spectral data. The spectral data is accompanied by a standard rate of rise operation of the gases within the chamber to determine the leak rate of the process chamber at the set pressure. The looping of this operation populates a full calibration table over different pressures within the process chamber.

During the fifth operation 410, pass/fail purity values are determined. The pass/fail purity values are determined using the calibration table formed during the fourth operation 408 and a maximum acceptable leak value. The maximum acceptable leak value may be user input and in some embodiments is about 0.1 mTorr/minute to about 1 mTorr/minute, such as about 0.3 mTorr/minute to about 0.7 mTorr/minute, such as about 0.5 mTorr/minute. When input into the calibration table, an acceptable purity value for the passing or failure of the leak test is determined by extrapolation or by matching the acceptable purity value to a previously measured leak rate. The pass/fail purity limit may be recalculated each time preventative maintenance is performed on the chamber.

In some embodiments, a calibration leak is utilized to determine the pass/fail threshold. In this embodiment, after a process chamber has been shown to be leak tight during the second operation 404 and the third operation 406, the intensity test using the spectral gauge is repeated with the calibrated leak open. The calibration leak is opened to release gas at a rate which would be a user pass/fail criteria. Therefore, the intensity for the gas concentration increase calculated during the use of the calibration leak becomes the pass/fail threshold.

FIG. 5 is a graph 500 illustrating the measured purity of a sample within a processing chamber over several trials. The measured purity is utilized using similar methods to those described above. On the graph, the purity value is represented by an arbitrary contamination rate (i.e., the increase in concentration of one or more gases over time) on the y-axis. The left side 502 of the graph shows trials performed in which there is no leak. The measured contamination rate of no leak $O_2$ 506 and the measured contamination rate of no leak $N_2$ 508 are shown. The right side 504 of the graph illustrates trials performed in which there is a leak, such as that emitted by the reference leak device 295. The reference leak may be a leak of about 0.3 mTorr/min. The measured contamination rate with a leaked $O_2$ 510 and the measured contamination rate with a leaked $N_2$ 512 are shown. As illustrated in the graph 500, the contamination rate of $N_2$ into the process chamber is able to be seen as significantly higher when comparing the no leak $N_2$ 508 trial values and the leaked $N_2$ 512 trial values. The contamination rate of $O_2$ into the process chamber is also visibly higher when comparing the no leak $O_2$ 506 trail values and the leaked $O_2$ 510 trial values.

FIG. 6 is a graph 600 illustrating the measured pressure within a process chamber over several trials. The graph 600 compares the pressure measurements at the beginning and end of the purity tests when there is a leak and when there is no leak within the process chamber. On the left side 602, the initial pressure without a leak 606 is determined using a pressure gauge, such as the vacuum gauge 293, and compared to a final pressure without a leak 608. As shown, even when there is no leak there is a small change in pressure within the process chamber. On the right side 604, the initial pressure with a leak 610 is determined using the pressure gauge and compared to a final pressure with a leak 612. There is a small change in pressure within the process chamber, but the change in pressure is roughly equivalent to the pressure change shown even when there is no leak. Therefore, the pressure difference within a process chamber has limited ability to detect small leaks within the process chamber, such as leaks of less than about 1 mTorr, such as leaks of less than about 0.5 mTorr. As shown in FIG. 5, leaks are more easily detected using spectral measurements and detecting the rate of increase in concentration of certain gases to calculate a purity value.

As described herein, the difficulty in determining the presence or severity of a leak within a process chamber is often difficult when relying on pressure data. Therefore, methods such as those described herein may provide an improved approach in detecting leaks or leak rates within the process chamber. Spectral measurement of the process chamber at low pressures can provide accurate and precise leak rate values. Monitoring the leak rate of the chamber can assist in determining if a chamber component has failed and reduce the number of substrates contaminated by the chamber. Maximum leak rates can be input by a user so that the system can be automated thereafter and alert the user if the leak rate exceeds the maximum leak rate input.

Methods described herein may be useful in any number of process chambers, but examples of an epitaxial deposition chamber and an RTP chamber are provided herein. Methods described herein are particularly suitable for epitaxial deposition chambers and RTP chambers as the deposition steps typically performed in these chambers are highly sensitive to contamination from outside atmosphere leaks.

While the foregoing is directed to embodiments of the present disclosure, other and further embodiments of the disclosure may be devised without departing from the basic scope thereof, and the scope thereof is determined by the claims that follow.

What is claimed is:

1. A method of detecting a vacuum leak comprising:
pumping a process chamber from a first pressure to a second pressure, wherein the second pressure is less than the first pressure;
enabling a spectral gauge;
closing a chamber isolation valve after pumping the process chamber to the second pressure;
collecting spectral data from a conduit using the spectral gauge for a sample time; and
calculating a chamber leak rate from the spectral data, wherein the chamber isolation valve is located in an exhaust conduit of the process chamber downstream of the spectral gauge and isolates the process chamber.

2. The method of claim 1, further comprising:
pumping the process chamber from the second pressure to a third pressure greater than the second pressure after collecting the spectral data; and
performing a substrate processing operation after pumping the process chamber to the third pressure.

3. The method of claim 1, wherein the collecting the spectral data is performed for about 15 seconds to about 100 seconds.

4. The method of claim 1, wherein the spectral data includes a concentration of oxygen, nitrogen, or both oxygen and nitrogen within the conduit.

5. The method of claim 1, wherein the chamber leak rate is calculated by comparing an intensity of gas concentration increase over time within the conduit to a pre-determined calibrated intensity of gas concentration increase over time.

6. The method of claim 1, wherein the second pressure is a predetermined pressure calculated during a calibration operation.

7. The method of claim 1, wherein the second pressure is a pressure at which a flow of foreline gases is lowest.

8. A method of processing a substrate comprising:
performing a leak detection test comprising:
pumping a process chamber to a leak test pressure;
enabling a spectral gauge;
closing a chamber isolation valve after pumping the process chamber to the the leak test pressure;
collecting spectral data from a conduit using the spectral gauge for a sample time; and
calculating a chamber leak rate from the spectral data;
pumping the process chamber from the leak test pressure to a processing pressure greater than the leak test pressure after collecting the spectral data; and
performing a substrate processing operation on a number of substrates after pumping the process chamber to the processing pressure; and
repeating the performing a leak detection test.

9. The method of claim 8, wherein the number of substrates comprises a plurality of substrates.

10. The method of claim 8, wherein the leak detection test is performed in less than 300 seconds.

11. The method of claim 8, wherein the leak detection test is performed at a temperature of greater than about 250° C.

12. The method of claim 8, wherein the leak test pressure is about 20 mTorr to about 300 mTorr.

13. The method of claim 8, wherein the spectral gauge measures radiation at a wavelength of about 250 nm to about 1000 nm.

14. A process chamber for processing a substrate comprising:
a chamber body defining a processing volume;
a process gas inlet;
a process gas outlet, the process gas outlet comprising:
a first conduit fluidly coupled between the processing volume and an exhaust pump;
a chamber isolation valve disposed between the processing volume and the exhaust pump; and
a spectral gauge fluidly coupled to the first conduit between the processing volume and the chamber isolation valve; and
a controller, the controller configured to:
pump the process chamber to a leak test pressure;
enable the spectral gauge;
close the chamber isolation valve after pumping the process chamber to the leak test pressure;

collect spectral data from the first conduit using the spectral gauge for a sample time; and calculate a chamber leak rate from the spectral data.

15. The process chamber of claim 14, further comprising:
a second conduit fluidly coupled between the first conduit and the spectral gauge; and
a gauge isolation valve disposed between the first conduit and the spectral gauge along the second conduit.

16. The process chamber of claim 14, further comprising:
a process gas source;
a process gas conduit disposed between the process gas source and the process gas inlet; and
a reference leak device fluidly coupled to the process gas conduit between the process gas source and the process gas inlet.

17. The process chamber of claim 16, wherein a reference leak isolation valve is disposed between the reference leak device and the process gas conduit.

18. The process chamber of claim 14, wherein a vacuum gauge is fluidly coupled to the first conduit between the chamber isolation valve and the processing volume.

19. The process chamber of claim 14, wherein the spectral gauge is an optical emission spectrometer.

20. A method of detecting a vacuum leak comprising:
pumping a process chamber from a first pressure to a second pressure, wherein the second pressure is less than the first pressure;

enabling a spectral gauge;

closing a chamber isolation valve after pumping the process chamber to the second pressure;

collecting spectral data from a conduit using the spectral gauge for a sample time;

calculating a chamber leak rate from the spectral data;

pumping the process chamber from the second pressure to a third pressure greater than the second pressure after collecting the spectral data; and performing a substrate processing operation after pumping the process chamber to the third pressure.

* * * * *